United States Patent [19]

Andros

[11] Patent Number: 5,311,634

[45] Date of Patent: May 17, 1994

[54] SPONGE CLEANING PAD

[76] Inventor: Nicholas Andros, 913 W. Glenrosa, Phoenix, Ariz. 85013

[21] Appl. No.: 12,910

[22] Filed: Feb. 3, 1993

[51] Int. Cl.$^5$ ............................................. A47L 25/00
[52] U.S. Cl. ......................................... 15/97.1; 15/102;
15/230; 15/230.16; 15/230.18; 15/244.1
[58] Field of Search ............ 15/97.1, 102, 230, 230.12,
15/230.14, 230.16, 244.1, 77, 230.18

[56] References Cited

U.S. PATENT DOCUMENTS

| | | | |
|---|---|---|---|
| 1,775,186 | 9/1930 | Bartling . | |
| 1,998,244 | 4/1935 | Lang | 15/230 |
| 2,030,911 | 2/1936 | Borden | 15/244.1 |
| 2,289,117 | 7/1942 | Harrison | 15/244.1 |
| 2,542,158 | 2/1951 | Soderberg | 15/97.1 |
| 2,609,347 | 5/1948 | Lumley . | |
| 2,640,209 | 6/1953 | Johnson | 15/97.1 |
| 2,880,432 | 4/1959 | Schnider et al. | 15/230.16 |
| 2,880,443 | 4/1959 | Le Febvre | 15/244.1 |
| 3,150,401 | 9/1964 | Taylor et al. | 15/311 |
| 3,585,668 | 6/1971 | Jaccodine et al. . | |
| 3,748,677 | 7/1973 | Frank et al. . | |
| 3,970,471 | 7/1976 | Bankes et al. | 134/6 |
| 4,024,596 | 5/1977 | Rioux . | |
| 4,101,999 | 7/1978 | Doyel | 15/97.1 |
| 4,103,381 | 8/1978 | Schulz et al. | 15/97.1 |
| 4,482,391 | 11/1984 | Pettingell et al. | 15/230.16 |
| 4,566,911 | 1/1986 | Tomita et al. . | |
| 4,811,443 | 3/1989 | Nishizawa | 15/102 |
| 5,187,827 | 2/1993 | Wei | 15/97.1 |

FOREIGN PATENT DOCUMENTS

| | | | |
|---|---|---|---|
| 289005 | 7/1935 | Italy | 15/97.1 |
| 90/11039 | 10/1990 | PCT Int'l Appl. | 15/244.1 |
| 914315 | 1/1963 | United Kingdom . | |
| 990142 | 4/1965 | United Kingdom | 15/230 |

*Primary Examiner*—Harvey C. Hornsby
*Assistant Examiner*—Mark Spisich
*Attorney, Agent, or Firm*—Don J. Flickinger; Jordan M. Meschkow; Lowell W. Gresham

[57] ABSTRACT

Disc shaped cleaning pads for use on cleaning apparatus, consisting of a supporting core to which a sponge is affixed. The sponge is a microporous material made from a hydroxylated polymer, the physical properties of which can be modified in the chemical growing process.

10 Claims, 2 Drawing Sheets

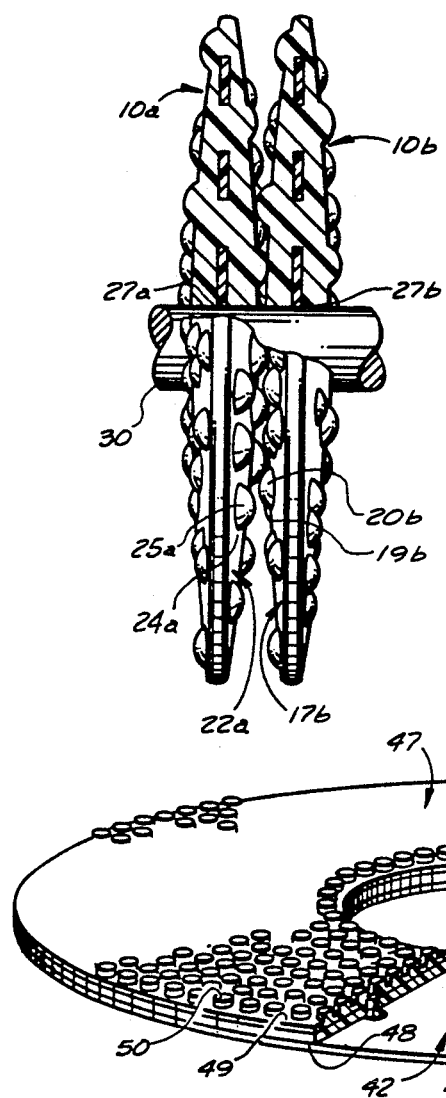
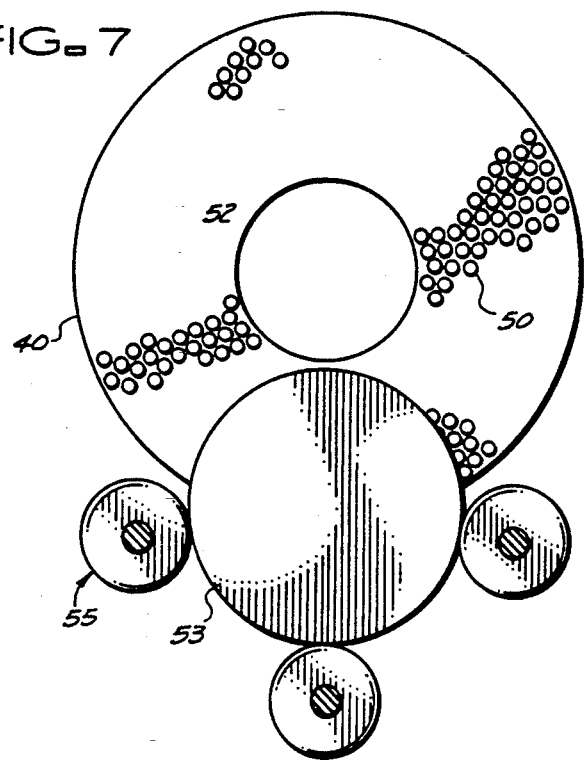
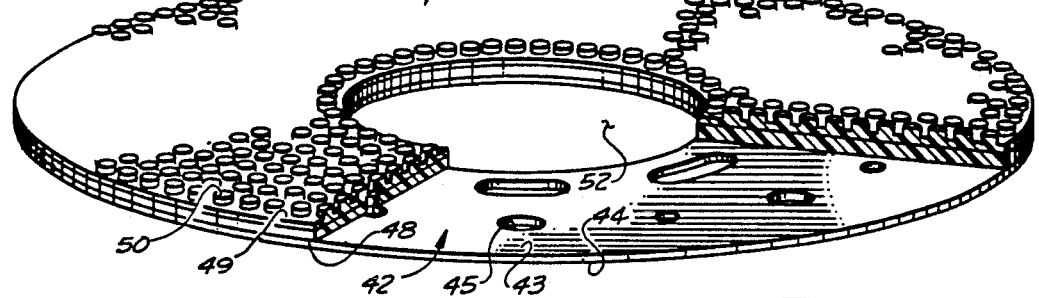
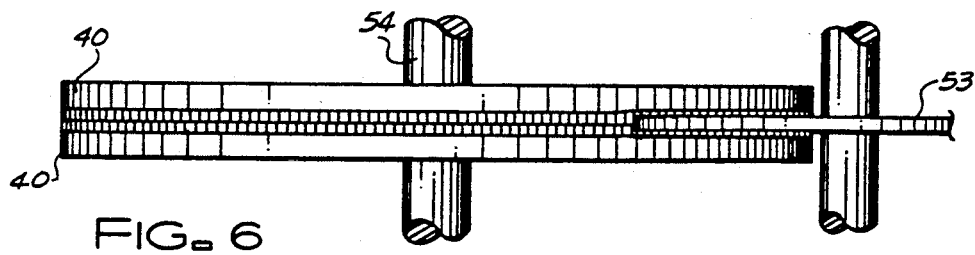

SPONGE CLEANING PAD

BACKGROUND OF THE INVENTION

1. Field of the Invention

This invention relates to cleaning brushes and method of use.

More particularly, the present invention pertains to cleaning brushes made of sponge material for use on a machine which cleans discs requiring very precise finishing.

2. Prior Art

Many industries today require the ability to efficiently clean highly finished surfaces, removing particles and other surface contaminants. Specific articles having highly finished surfaces include wafers of semiconductor material, and memory discs.

Semiconductor wafers must be cleaned prior to any processing steps used to produce semiconductor devices. Due to the fragile nature of semiconductor wafers, achieving a high degree of cleanliness, as well as high yield of clean wafers is difficult. Many cleaning devices produce a low yield of clean wafers, due to breakage, or an unacceptable level of surface contaminants.

Memory discs provide less of a problem, being more durable, and requiring, at this time, a lesser degree of cleanliness.

Currently, cleaning devices have been developed to overcome some of these problems. Devices for cleaning wafers generally consist of a cylindrical roller passing over a wafer. The cylindrical roller conventionally includes tufted nylon or other types of bristles extending from a central core. The bristle roller brushes are fixed horizontally and rotated as the wafer or memory disc is passed between the bristle surfaced brushes while the surfaces are copiously drowned in cleaning solution or deionized water.

Wafers cleaned in this manner are often unacceptable due to particles and other surface contaminants missed or passed over in the process. In addition, the softness of the bristles varies according to their composition resulting in a heterogeneous mixture of bristles, each harder or softer than their counterparts. This results in the breakage of the wafers and a loss of circuits, as well as damage to wafer surfaces. Other drawbacks, resulting in unsatisfactory cleaning, may be attributed to the hydrophobic nature of bristle tufted brushes. The fiber surfaces of these brushes are never wetted, and require large amounts of deionized water or cleaning solution to work in the cleaning process.

Memory discs, being more durable in nature and requiring a lesser degree of particle removal, are presently cleaned utilizing a series of mechanical metal wheels each having a plurality of apertures extending therethrough, which receive pieces of hand placed rectangular cubes of porous sponge. Each cube is placed through one of the apertures and manually adjusted by eye to form a nub protruding equidistance from either side of the metal wheel. The manual fabrication technique of these cleaning wheels is long and cumbersome, resulting in increased cleaning costs. Furthermore, these cleaning wheels are inefficient when attempting to clean memory discs. Many times, the final manually constructed brush has overlapping or undersized sponge patterns distributed across its surface due to the difficulties in manually placing the sponge cubes within the apertures of the metal wheels so that the extend equidistance from either surface. The resulting manually fabricated wheels are then gang assembled on a keyway, separated by fixed spacers. Memory discs are then allowed to revolve and rotate between the paired wheels. In this manner both sides of the memory discs are washed simultaneously by the action of the cubic rectangular sponges upon their surfaces.

It would be highly advantageous, therefore to remedy the foregoing and other deficiencies inherent in the prior art.

Accordingly, it is an object of the present invention to provide a cleaning pad for cleaning highly finished surfaces.

Another object of the present invention is to provide a cleaning pad which is relatively inexpensive to produce.

And another object of the present invention is to provide a cleaning pad which may be adapted to a variety of cleaning requirements.

Still another object of the present invention is to provide a cleaning pad which applies a uniform cleaning force to the surface being cleaned.

Yet another object of the present invention is to provide a cleaning pad which allows cleaning fluid to flow freely therethrough.

Yet still another object of the present invention is to provide a cleaning pad which is gentle on the surface being cleaned, substantially eliminating breakage of fragile articles such as semiconductor wafers.

A further object of the present invention is to provide a cleaning pad which is capable of cleaning contours and edges of disc shaped objects due to its three-dimensional shape.

Yet a further object of the present invention is to provide a cleaning pad which is hydrophilic, retaining fluid, and releasing it selectively upon the surface to be cleaned.

And yet a further object of the present invention is to provide a cleaning pad which acts as a pumping and suction cleaning device.

SUMMARY OF THE INVENTION

Briefly, to achieve the desired objects of the present invention in accordance with a preferred embodiment thereof, provided are a disc shaped core having opposed major surfaces, and a plurality of apertures extending therethrough, and a disc shaped sponge having opposed major surfaces. One of the opposed major surfaces of the disc shaped sponge is affixed to one of the opposed major surfaces of the disc shape core. Next provided is coupling means for coupling the disc shaped cleaning pad to the cleaning apparatus.

In accordance with a more specific embodiment, an improved cleaning apparatus, for cleaning disc shaped articles, having a rotatable shaft for receiving a pair of cleaning pads is provided. The improvement consists of the conventional cleaning brushes being replaced by cleaning pads, each as described above, sandwiching a portion of the disc shaped article to be cleaned therebetween.

The above objects and advantages are further realized in methods of using the cleaning pads, and in methods of fabricating the cleaning pads.

BRIEF DESCRIPTION OF THE DRAWINGS

The foregoing and further and more specific objects and advantages of the instant invention will become readily apparent to those skilled in the art from the following detailed description of the preferred embodiment thereof taken in conjunction with the drawings in which:

FIG. 4 illustrates the intermeshing of projections extending from paired cleaning pads;

FIG. 5 is a partial sectional perspective view of a single sided cleaning pad;

FIG. 6 illustrates single sided cleaning pads mounted on a cleaning apparatus for cleaning semiconductor wafers; and FIG. 7 is a top plan view illustrating a wafer positioned in the cleaning apparatus illustrated in FIG. 5.

DETAILED DESCRIPTION OF THE PREFERRED EMBODIMENT

Figure 1:
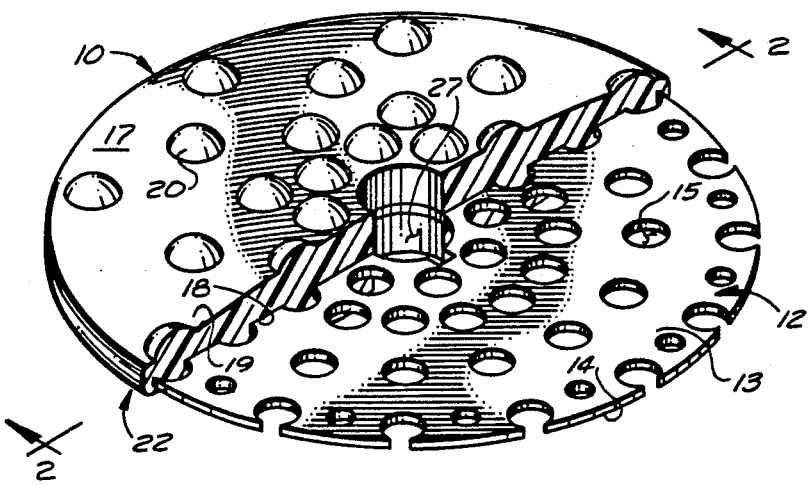
FIG. 1 is a partial sectional perspective view of a cleaning pad, constructed in accordance with the teachings of the instant invention.
Figure 2:
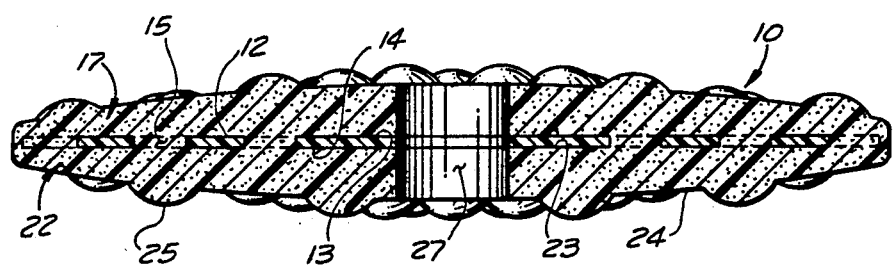
FIG. 2 is a cross-sectional view taken along line 2—2 of FIG. 1.

Turning now to the drawings in which like reference characters indicate corresponding elements throughout the several views, attention is first directed to FIGS. 1 and 2 which illustrate a disc shaped cleaning pad generally designated 10. Cleaning pad 10 includes a disc shaped core 12 having opposed, generally planar major surfaces 13 and 14, and a plurality of apertures 15 extending therethrough. Core 12 may be formed from substantially any rigid material such as metal or plastic, giving cleaning pad 10 rigidity and support.

A first generally disc shaped sponge 17 having opposed major surfaces, one of which is a generally planar surface 18 and the other of which is a convex surface 19, is affixed to core 12. Planar surface 18 of first sponge 17 is affixed to major surface 13 of core 12. First sponge 17 may be affixed to core 12 in a variety of methods, such as by forming first sponge 17 directly onto core 12 during the casting process. This is accomplished by allowing the sponge resin in the manufacturing process to flow through the plurality of apertures 15 and affixed thereto during the casting process, which will be discussed in greater detail below. However, the preferred method of affixing first sponge 17 to core 12 is by use of an adhesive.

Convex surface 19 of first sponge 17 includes a plurality of projections. Preferably, the projections are a plurality of hemispherical nubs 20 integrally formed with and extending outwardly from convex surface 19 in a concentric series about a central axis of first sponge 17. While nubs 20 in FIGS. 1 and 2 are illustrated as being hemispherical, those skilled in the art will understand that the geometry of nubs 20 may be ellipsoid, cubic, conical or a variety of other shapes. Furthermore, any pattern or projections may be employed on convex surface 19.

A second substantially disc shaped sponge 22 is affixed to major surface 14 of core 12. Second sponge 22 is substantially identical to first sponge 17, including opposed major surfaces one of which is a generally planar surface 23, and the other of which is a convex surface 24. Planar surface 23 of second sponge 22 is affixed to major surface 14 of core 12. Convex surface 24 of second sponge 22 includes a plurality of projections. As in first sponge 17, these projections are preferably a plurality of hemispherical nubs 25 integrally formed with and extending outwardly from convex surface 24 in a concentric series about a central axis. Again, as discussed above, the plurality of projections may have a variety of different geometric forms.

Second sponge 22 differs from first sponge 17 in that the pattern of nubs 25 extending from convex surface 24 is shifted in relation to, and intermesh or nest with nubs 20 of first sponge 17. This nesting of nubs 20 and 25 becomes important during the cleaning of memory discs, wafers or other disk shaped objects having highly finished surfaces, when two or more cleaning pads 10 are placed together along a common axis. This will be discussed in greater detail below.

Second sponge 22 is affixed to core 12 in the same manner as discussed above for first sponge 17, with the use of adhesive being preferred. A further method of affixing sponge material to core 12 would include molding an entire envelope consisting of first sponge 17 and second sponge 22 forming a single piece joined along their edges and through apertures 15. During the casting process, core 12 would be placed in a mold into which sponge resin is injected. The sponge resin flows through apertures 15 and completely incapsulates core 12. In this manner, an internally rigid core 12 is internally bonded on all sides by an envelope formed of first sponge 17 and second sponge 22.

Cleaning pad 10 further includes attachment means for fastening it to a cleaning apparatus. In this preferred embodiment, attachment means consists of an axial bore 27 extending through the central axis of first and second sponges 17 and 22, and core 12. Axial bore 27 allows a plurality of cleaning pads 10 to be fastened to a rotatable shaft used in many conventional cleaning apparatus. Those skilled in the art will understand that various other assemblies are known for fastening brushes to cleaning apparatus, and that cleaning pads 10 may be fastened to varying cleaning apparatus in any required manner.

Figure 3:
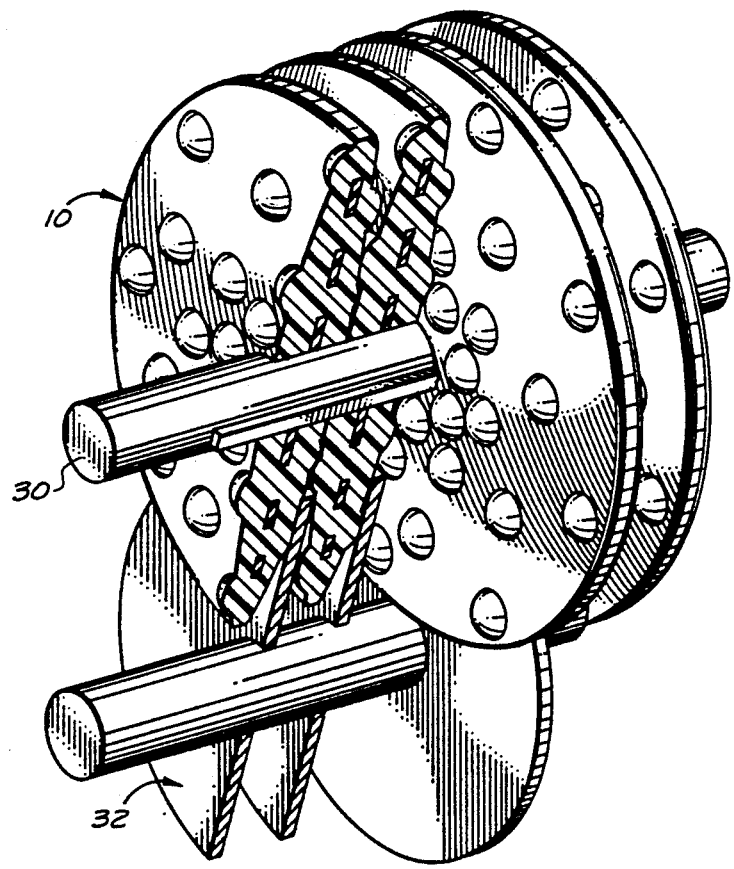
FIG. 3 is a partial sectional perspective view illustrating the positioning of cleaning pads on the rotatable shaft of a cleaning apparatus, and disc shaped articles mounted therebetween for cleaning.

Referring now to FIG. 3, a diagrammatic view of the brush assembly and disc support structure of a conventional cleaning apparatus is illustrated, solely to provide a clear perspective of the use of cleaning pads 10 in a conventional disc cleaning apparatus. In these cleaning apparatus, up to 26 cleaning pads may be gang assembled along a common axis of a rotating shaft 30 received through bore 27. The plurality of cleaning pads 10 are separated by fixed spacers to securely hold them in place relative one another. The spacing and interaction of paired cleaning pads 10 will be discussed in greater detail in connection with FIG. 4 below. The rotation of rotatable shaft 30 spins cleaning pads 10 in either direction. Memory discs 32, primarily cleaning in this type of machine, are then allowed to rotate in the spaces between cleaning pads 10. Memory discs 32 are supported by a supporting device such as a wire cage or a shaft, both of which are well-known to those skilled in the art and are therefore not discussed in detail here. Assembled in this matter, cleaning pads 10 wash both sides and edges of memory discs 32 simultaneously by the action of the projections extending from their surfaces.

Referring now to FIG. 4, an enlarged view of a pair of cleaning pads 10 mounted on rotating shaft 30 is illustrated. To distinguish between identical cleaning pads 10, the cleaning pads in FIG. 4 will be identified as cleaning pad 10a and 10b, with a and b being added after the reference characters of the elements respectively.

Cleaning pads 10a and 10b are illustrated placed together along the common axis of rotatable shaft 30 extending centrally through axial bores 27a and 27b. Second sponge 22a of cleaning pad 10a is placed proximate first sponge 17b of cleaning pad 10b, so that nubs 25a nest within the pattern of nubs 20b. Convex surfaces 24a and 19b and nubs 25a and 20b form an intimate three-dimensional surface for cleaning edges as well as surfaces of memory disc 32. The shape of convex surfaces 24a and 19b prevent hour glassing, a phenomena well-known to those skilled in the art, of the cleaning profile, such that as more force is applied against the surfaces of the memory disc, the nubs 25a and 20a proximate axial bore 27a and 27b are slightly compressed to compensate for the hour glassing as found in conventional cleaning brushes. In this fashion, equal cleaning force is applied across the entire surface of the item being cleaned.

While cleaning pad 10 specifically includes convex surfaces 19 and 24, it will be understood that these surfaces may be fabricated with different profiles such as stepped, parabolic, concave or as discussed above convex. Furthermore, it will also be understood that a single sponge sided cleaning pad may be required instead of a double sided cleaning pad, depending upon the cleaning apparatus used, and the article to be cleaned.

An alternate embodiment generally designated 40 illustrated in FIG. 5, is very similar to cleaning pad 10, including a disc shape core 42 having opposed generally planar, major surfaces 43 and 44, and a plurality of apertures 45 extending therethrough. A disc shaped sponge 47 having opposed major surfaces 48 and 49, each of which are generally planar, is affixed to core 42. Sponge 47 may be affixed to core 42 using the various methods as discussed above regarding cleaning pad 10, but preferably, major surface 48 is affixed to major surface 43 by an adhesive. Opposing major surface 49 includes outwardly extending projections, which in this embodiment are flat topped circular nubs 50. As discussed regarding cleaning pad 10, the projections may have a wide variety of geometries and patterns.

Cleaning pad 40 also includes attachment means for attaching it to a cleaning apparatus. Attachment means include an axial bore 52 extending through the central axis of sponge 47 and core 42. Cleaning pad 40 would be used in pairs on a wafer cleaning apparatus such as the Westech Systems Model 3800 Double-Sided Wafer Cleaner. FIGS. 6 and 7 illustrate the relationship between cleaning pad 40 and a wafer 53. A pair of cleaning pads 40 are mounted on a vertical shaft 54 extending through axial bore 52. Wafer 53 is supported horizontally, with a portion thereof positioned between cleaning pads 40. Cleaning pads 40 are then moved together, to press wafer 53 therebetween, each exerting substantially identical pressure on wafer 53. Wafer 53 is supported by a 3 point roller assembly 55, which permits a portion to extend between cleaning pads 40. Rotation of vertical shaft 54 rotates cleaning pads 40, cleaning both surfaces of wafer 53. The rotation of cleaning pads 40 imparts a rotation to wafer 53 in its suspension, resulting in the presentation of its entire surface to be cleaned. The details of the cleaning apparatus are not discussed or shown in detail, since they are well-known to those skilled in the art and are not required for an enabling disclosure of the present invention.

The sponges used in cleaning pads 10 and 40 are chemically grown ultrasoft sponges whose physical properties include high elasticity, good tensile strength, high water absorbency, non-lint or particle producing, and chemically inert. This material has the ability to provide a three-dimensional flexible surface which can reach about the contours and sides of a wafer disc or memory disc and still exhibit softness, springback, pliability, good compressibility, smoothness, and retain a structural memory. A microporous material provides these characteristics, and can be cast in a mold to obtain the desired shapes discussed above. The microporous material used in the sponges of cleaning pads 10 and 40 are made from a hydroxylated polymer whose degree of polymerization is in a range of 1700 to 2500, and preferably between 1700 and 1800, and molecular weights of 75,000 to 120,000, preferably between 75,000 and 85,000.

The formation of a graft copolymer with other monomers modifies the physical properties of the microporous sponge, as well as to act as crosslinking agents. The crosslinking of Polyvinyl Alcohol, in the presence of a strong acid with such monomers as 1, 3, 5, 7, Tetraazatricyclo (3.3.1.13, 7) Decane, Pentaerythrite, alpha, trioxymethylene (meta formaldehyde), Methanol, or 2-Furaldehyde, produces a wide spectrum of physical properties which control hydrophilicity, softness or hardness, flexibility, and other parameters as described above. Examples of methods of producing sponges having various characteristics include:

EXAMPLE 1

One hundred thirty five grams of polyvinyl alcohol having a degree of polymerization of approximately 1700 to 2500, is slowly added with stirring to 1000 ml of water. The slurry that is produced is then cooked at 200° F. until all of the polyvinyl alcohol goes into solution. A surfactant is added, which is preferably nonionic, though other surfactants and combinations thereof, can be used to modify the cell structure and its properties. The solution is cooled to room temperature, with the aid of slow mechanical stirring, and a solution containing 32 grams of 1, 3, 5, 7 tetraazatricyclo (3.3.1.13,7) Decane is added slowly till thoroughly dispersed. With the aid of a high speed high shear mechanical stirrer, capable of aerating this mixture, the solution is vigorously frothed and whipped till a rise of $2\frac{1}{2}:1$ is observed in the foam and froth volume. One hundred ml of 30% sulfuric acid is slowly added after the froth rise reaches $2\frac{1}{2}:1$. this acid catalyst is rapidly stirred for 60 sec. or less, till thoroughly dispersed into the polyvinyl alcohol mixture, and the resulting mixture of polyvinyl alcohol, cross linking agent and acid catalyst, is poured into a suitable mold. The mixture is cured at 110°–120° F. for 10 hours and demolded; the sponge that is produced is extracted in 5% sodium bicarbonate solution, then followed by copious washing is water for (4) four additional extractions till all the excess surfactant and catalyst is removed. The resulting sponge is a microporous, soft, reticulated matrix of cross linked polyvinyl alcohol.

EXAMPLE 2

To 150 grams of polyvinyl alcohol having a degree of polymerization of approximately 2000, is slowly added to 1000 ml of water and cooked per the procedure in example 1. Anionic surfactant such as sodium alpha olefin sulfonate in an amount equal to $\frac{1}{2}$-1% by weight of the PVA solids is added and the resulting solution is frothed to a minimum rise of 2:1. A solution of 56 grams of Pentaerythritol is slowly added to the froth, and the mixture vigorously stirred and aerated till a stable rise of approximately 2½:1 is achieved. To this mixture is added 100 ml of 37% methanal and frothing continued until the entire mixture is homogeneous. One hundred (100) ml of 10.3 Normal Sulfuric Acid solution is quickly added, with vigorous stirring, and the entire mixture is poured into a suitable mold. The reaction is allowed to crosslink and cure as 120° F. for a duration of 10 hours. The mold is opened thereafter, and the resulting sponge is drowned in copious amounts of sodium bicarbonate solution, and further extracted and purified as in example 1. The resulting sponge has a partially reticulated, open celled, microporous structure.

EXAMPLE 3

1000 ml of commercial 2-Furaldehyde is fractionally distilled at 760 mm and a distilling head temperature of 160°-162° C. The freshly prepared distillate is chilled and stored in a dark covered flask till used. Polyvinyl alcohol resin with a degree of polymerization of approximately 1750 is made up per the procedure of example 1. To this mixture is added 1% by weight of PVA solids, a nonionic surfactant such as polyoxyethylene (20) sorbitan monolaurate or polyoxyethylene (2) stearyl ether. The mixture is frothed to a rise of 2-2 1/2:1 until the rise can no longer support further aeration. 50 ml of cold freshly distilled 2-Furaldehyde is slowly added with vigorous stirring and allowing the rise to remain at 2:1 froth height. The mixture is cooled to ambient temperature, and preferably chilled, before the addition of an acid catalyst of 10.3 N Sulfuric acid solution. 100 ml of catalyst is added, and vigorously stirred. The mixture is quickly poured into a suitable mold. Reaction time is catalyzed within ten minutes or less. The mold is cured at 115° F. for 10 hours and the resulting sponge is processed per the example described in example 1 above.

The resulting sponge is open celled, and partially hard with a durometer reading of 50-55 Shore A scale.

EXAMPLE 4

The identical procedure of example 3 is repeated but the quantity of 2-Furaldehyde is lowered to 25 ml. By varying the mole amounts of 2-Furaldehyde, the resulting sponge becomes soft and microporous, highly reticulated with open celled structures.

EXAMPLE 5

The identical procedure in example 3 is repeated with the exception that an Anionic surfactant is used such as Sodium Laureth Sulfate or Sodium alcohol ether Sulfate. The resulting sponge is highly reticulated, ultrasoft and is identical to Sea Sponge.

Having fully described the invention in such clear and concise terms as to enable those skilled in the art to understand and practice the same, the invention claimed is:

1. A disk shaped cleaning pad for use in combination with a cleaning apparatus, said cleaning pad comprising:
    a disk shaped core having opposed major surfaces, an axis of rotation extending through said major surfaces, and having a plurality of apertures extending therethrough;
    a first disk shaped sponge having projections integrally formed therewith and extending outwardly therefrom, affixed to one of said major surfaces;
    a second disk shaped sponge having projections integrally formed therewith and extending outwardly therefrom, affixed to said other of said major surfaces of said disk shaped core; and
    coupling means for coupling said cleaning pad to said cleaning apparatus, said coupling means including a bore extending axially through said disk shaped core at said axis of rotation, to be received about a rotatable shaft of said cleaning apparatus.

2. A cleaning pad as claimed in claim 1 wherein said projections of said first disk shaped sponge and said second disk shaped sponge are configured to intermesh with adjacent cleaning pads mounted on said rotatable shaft of said cleaning apparatus when said cleaning pad is received about said shaft.

3. A cleaning pad as claimed in claim 1 wherein said first and second disk shaped sponges include a hydroxylated polymer having a degree of polymerization in the range of 1700-2500, and a molecular weight in the range of 75,000-120,000.

4. Improvement to a cleaning apparatus having driving means for rotating cleaning pads, and support apparatus for supporting a disk shaped article having a first and a second surface, said improvement comprising:
    a first and a second cleaning pad mounted on said driving means in opposed fashion for receiving said disk shaped article therebetween such that said first and second surfaces of said disk shaped article is adapted to be in cleaning engagement with said first and second cleaning pads respectively;
    said first and second cleaning pads each including;
        a disk shaped plate having opposed major surfaces, an axis of rotation extending through said major surfaces and having a plurality of apertures extending therethrough,
        a disk shaped sponge affixed to one of said major surfaces; and coupling means for coupling said cleaning pad to said driving means.

5. An improvement as claimed in claim 4 wherein said drive means includes a rotatable shaft.

6. An improvement as claimed in claim 5 wherein said coupling means includes a bore extending axially through said disk shaped sponge and said disk shaped plate at said axis of rotation, to be received about said rotatable shaft of said cleaning apparatus.

7. An improvement as claimed in claim 6 wherein each of said disk shaped sponges includes projections integrally formed therewith, extending outwardly therefrom.

8. An improvement as claimed in claim 7 wherein each of said cleaning pads further includes a second disk shaped sponge affixed to said other of said major surfaces of said disk shaped plate.

9. An improvement as claimed in claim 8 wherein each of said second disk shaped sponges includes projections integrally formed therewith, extending outwardly therefrom.

10. An improvement as claimed in claim 9 wherein said projections of said first disk shaped sponge of said first cleaning pad, intermesh with said projections of said second disk shaped sponge of said second cleaning pad.

* * * * *